United States Patent

Ito

[11] Patent Number: 5,886,527
[45] Date of Patent: Mar. 23, 1999

[54] METHOD AND DEVICE FOR MONITORING DETERIORATION OF BATTERY

[75] Inventor: Masaki Ito, Iwata, Japan

[73] Assignee: Yamaha Hatsudoki Kabushiki Kaisha, Iwata, Japan

[21] Appl. No.: 913,678
[22] PCT Filed: Jan. 27, 1997
[86] PCT No.: PCT/JP97/00169
§ 371 Date: Sep. 9, 1997
§ 102(e) Date: Sep. 9, 1997
[87] PCT Pub. No.: WO97/27495
PCT Pub. Date: Jul. 31, 1997

[30] Foreign Application Priority Data

Jan. 26, 1996 [JP] Japan .................................... 8-011942

[51] Int. Cl.$^6$ ............................ G10R 31/36; H01M 10/44
[52] U.S. Cl. ........................ 324/431; 324/426; 324/427; 320/150; 320/153
[58] Field of Search .................................... 324/426, 427, 324/431, 433, 435; 340/636; 320/134, 136, 152, 153, 155, 156, 157, 144, 150

[56] References Cited

U.S. PATENT DOCUMENTS

| 3,852,652 | 12/1974 | Jasinski | 320/150 |
| 4,755,735 | 7/1988 | Inakagata | 320/153 |
| 5,583,871 | 12/1996 | Simmonds et al. | 320/156 |
| 5,675,258 | 10/1997 | Kadouchi et al. | 324/431 |
| 5,680,030 | 10/1997 | Kadouchi et al. | 320/152 |
| 5,686,815 | 11/1997 | Reipur et al. | 324/426 |

FOREIGN PATENT DOCUMENTS

| 3-137780 | 6/1991 | Japan | 324/431 |

*Primary Examiner*—Diep N. Do
*Attorney, Agent, or Firm*—KNobbe, Martens, OLson & BearLLP

[57] ABSTRACT

This invention makes it possible to inform a user of a battery replacement timing and a necessity for maintenance by storing in advance a reference vale of average battery temperature rise speed, obtaining an actual value of average battery temperature rise speed by measuring the battery temperature during charging, determining the battery deterioration easily, reliably, and irrespective of ambient temperatures at which the battery is charged and discharged by comparing the actual value of average battery temperature rise speed with the reference vale of average battery temperature rise speed.

9 Claims, 2 Drawing Sheets

METHOD AND DEVICE FOR MONITORING DETERIORATION OF BATTERY

FIELD OF THE INVENTION

This invention relates to method and device for monitoring deterioration in storage battery mounted as a power source for example on an electric motor-operated vehicle.

TECHNICAL BACKGROUND

For example, there are the Ni-MH secondary battery and the lead-acid secondary battery as batteries to be mounted as a power source for the electric motor-operated vehicle. The discharge capacity of such batteries gradually decreases through cyclic uses.

It is conceivable to carry out the maintenance including replacing, cleaning, and replenishing the electrolyte liquid of the battery after determining the deterioration of the battery by a voltage comparison method. However, the voltage comparison method requires cumbersome temperature compensation because the battery voltage itself changes with the ambient temperature.

Therefore, at the moment there is no simple, reliable means for constantly providing information on the necessity for the maintenance by accurately determining the state of deterioration of the battery as a power source of the electric motor-operated vehicle even during use, although such information is important.

The object of the invention made in view of the above situation is to provide method and device for monitoring deterioration in the storage battery that makes it possible to determine simply and reliably the state of deterioration in the storage battery capacity.

DISCLOSURE OF THE INVENTION

The storage battery deterioration monitoring method of the invention makes it possible always to accurately determine the state of deterioration of the battery irrespective of the ambient temperatures at which charging and discharging are carried out and to inform a user of the necessity for maintenance and the battery replacement timing through the following steps: A reference value of average battery temperature rise speed is stored in advance, an actual value of the average battery temperature rise speed is determined from the measurement of the battery temperature rise during charging, and the actual value of the average battery temperature rise speed is compared with the reference value of the average battery temperature rise speed to determine the degree of deterioration of the battery.

The value of the average battery temperature rise speed is determined by measuring and storing the battery temperature at the time of starting charging at a constant current, farther measuring the battery temperature after a specified period of time of charging, and calculating the average battery temperature rise speed for the specified period of time. The average battery temperature rise speed calculation makes accurate determination possible.

Also, display of deterioration level and/or warning of battery deterioration based on the determination of battery deterioration may inform the user of the necessity for the battery replacement timing and maintenance.

The battery deterioration monitoring device of the invention comprises; reference value storage means for storing the reference value of the average battery temperature rise speed, battery temperature detection means for measuring the battery temperature during charging, battery temperature rise speed calculating means for determining the average battery temperature rise speed by measuring the battery temperature during charging, and battery deterioration degree determination means for determining the degree of battery deterioration by comparing the actual value of the average battery temperature rise speed with the reference value of the average battery temperature rise speed. Comparison of the actual value of the average battery temperature rise speed with the reference value of the average battery temperature rise speed, and determination of the degree of deterioration easily and accurately irrespective of the ambient temperatures at which the battery is charged and discharged makes it possible to determine the degree of battery deterioration accurately and to inform the user of the battery replacement timing and the necessity for maintenance.

Also, the battery temperature rise speed calculating means measures and stores the battery temperature at the start of charging at a constant current, measures the battery temperature after a specified period of time of charging, and then calculates the average battery temperature rise speed for the specified period of time. Since the average battery temperature rise speed is calculated with a simple device, accurate determination is made.

Also, deterioration level display means for displaying the deterioration level based on the determination of the degree of the battery deterioration and/or battery deterioration warning means for issuing warning of the battery deterioration are provided. By using a simple device and displaying the deterioration level and/or issuing battery deterioration warning, the user is reliably informed of the battery replacement timing and the necessity for the maintenance.

THE BEST FORM OF IMPLEMENTING THE INVENTION

An embodiment of method and device for monitoring battery deterioration will be hereinafter described in detail in reference to the drawings.

Figure 1:
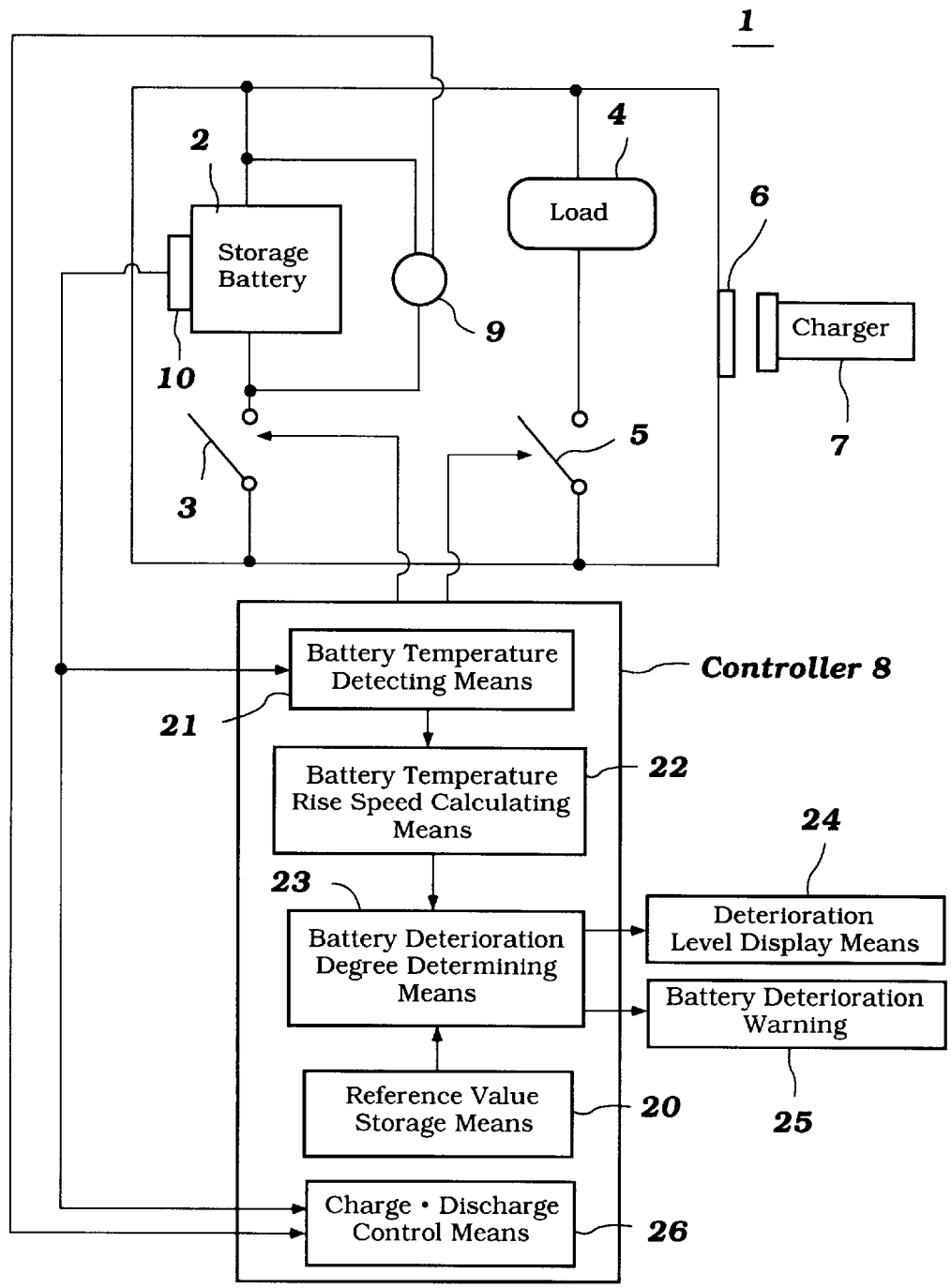
FIG. 1 is a block diagram roughly showing a battery deterioration monitor device.

FIG. 1 is a block diagram roughly showing a battery deterioration monitor device.

Figure 2:
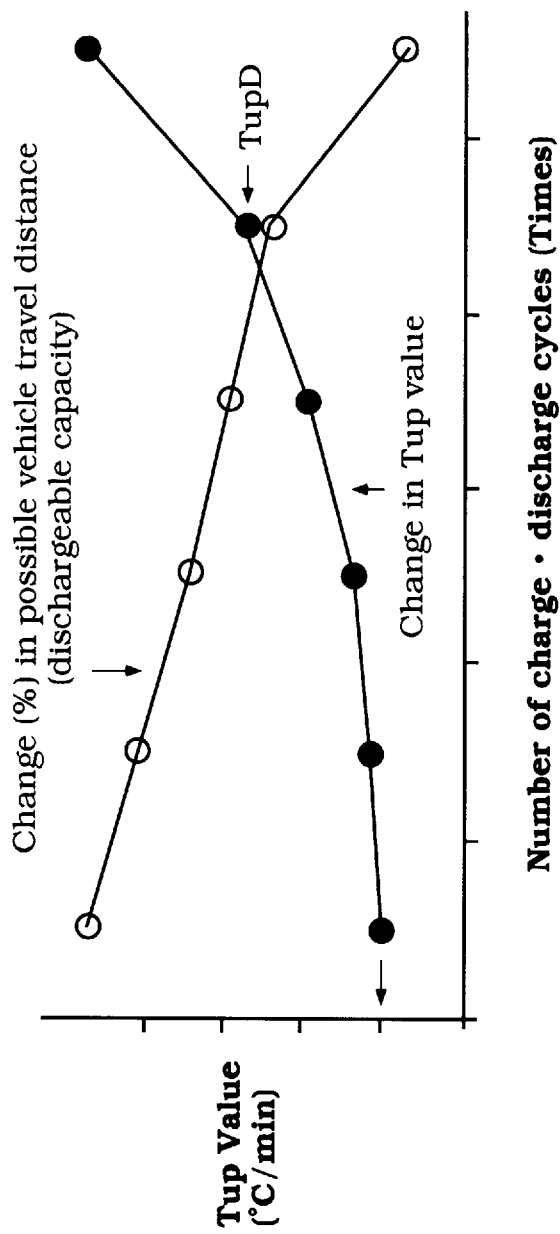
FIG. 2 is a graph of test results showing the relationship between dischargeable capacity after repeated charge-discharge cycles and average temperature rise speed of the battery during charging.

FIG. 2 is a graph of test results showing the relationship between dischargeable capacity after repeated charge-discharge cycles and average temperature rise speed of the battery during charging. In the graph, the line showing the change in Tup values shows the reference value.

A battery deterioration monitor device 1 monitors the deterioration of a battery 2 mounted on a motor-operated vehicle such as an electric motor-assisted bicycle. A series circuit of the battery 2 and a switch 3 is connected in parallel to a series circuit of a load 4, a switch 5, and a connector 6. At the time of charging, a charger 7 is connected through the connector 6. The battery 2 is a Ni-MH secondary battery for example. The load 4 is an electric motor or the like.

The switches 3 and 5 are controlled with charge-discharge control means 26 in a controller 8. To run the electric motor-operated vehicle, the switches 3 and 5 are closed to discharge electric power to the load 4. The control means 26 also controls the amount of electric discharge to the load 4 during the running. When the electric motor-operated vehicle is stopped for charging at night for example, the battery 2 is connected through the connector 6 to a charger 7, and the charge-discharge controller 26 controls to close the switch 3 and open the switch 5 so that the battery 2 is charged.

In this way, charge-discharge cycle of the battery 2 relative to the load 4 is repeated (cyclic uses) with commands from the charge-discharge controller 26 of the controller 8. Here, a voltage sensor 9 detects the voltage of the battery 2 and the voltage information is sent to the charge-discharge control means 26 so that a voltage $-\Delta V$ is detected during charging, and a final voltage is detected during discharging. Also, the temperature of the battery being charged is monitored with a temperature sensor 10 and the temperature information is sent to battery temperature detection means 21 and the charge-discharge control means 26 of the controller 8.

The controller 8 comprises; reference value storage means 20, battery temperature detection means 21, battery temperature rise speed calculation means 22, and battery deterioration degree determination means 23. The reference value storage means 20 stores in advance the reference value (the line in FIG. 2 showing the change in the value of Tup) of the average temperature rise speed of the battery 2. The battery temperature detection means 21 calculates the battery temperature using the temperature information from the temperature sensor 10. The battery temperature rise speed calculation means 22 measures the temperature of the battery 2 during charging and calculates the average temperature rise speed of the battery 2. In this embodiment, in the Ni-MH battery for example, at the time of charging at a constant current, the first step charging is finished by the detection of a voltage $-\Delta V$, or dT/dt, and the battery temperature, and moves on to the next charging. With this method, the battery temperature (Ts) at the start of constant current charging and the battery temperature (T10) after for example 10 minutes from the charging start are measured, and the average temperature rise speed of the battery 2 over the 10 minutes (° C./min) is calculated as the battery temperature (T10) after 10 minutes from the charging start minus the battery temperature at the charging start divided by 10 minutes.

The battery deterioration degree determination means 23 determines the deterioration degree of the battery 2 by comparing the actual value of the average temperature rise speed of the battery 2 with the reference value of the average temperature rise speed of the battery 2. That is to say, the state of deterioration of the battery 2 is determined by comparing the actual average temperature rise speed value Tup of the battery 2 with the average temperature rise speed value Tup which has been stored in advance.

Here, the period of time for calculating the average temperature rise speed of the battery 2 is not limited to 10 minutes used in this embodiment. However, for improving the accuracy, 5 minutes or longer is preferable. The battery temperature rise speed may be determined accurately with the charging time of 10 minutes, which applies to all the Ni-MH batteries.

The battery deterioration monitor device 1 is also provided with deterioration level display means 24 for displaying the determined deterioration level and battery deterioration warning means 25 for issuing battery deterioration warning. The degree of battery deterioration is determined with the controller 8 and the deterioration level is displayed with the deterioration level display means 24. The deterioration level display indicates how many cycles of discharge may be made or how many kilometers the vehicle may run from now on in either analog or digital form. Also, battery deterioration warning is issued from the battery deterioration warning means 25. The battery deterioration warning may be issued by either a lamp or a buzzer. In this way, using the simple device of the deterioration level display means 24 or the battery deterioration warning means 25, the user is reliably alerted to the battery replacement timing or the necessity for maintenance.

As seen from FIG. 2 of the relationship between the possible vehicle travel distance (dischargeable capacity) and the average battery temperature rise speed value Tup, the possible vehicle travel distance (dischargeable battery capacity) decreases, and the average battery temperature rise speed value Tup increases with the lapse of discharge cycles. When the deterioration level exceeds a certain value (Tup= TupD), the battery capacity thereafter decreases rapidly. When the value Tup becomes equal to the value TupD, warning is issued with the deterioration level display means 24 or the battery deterioration warning means 25 to inform the user of the battery replacement timing before the discharge capacity decrease rapidly or the necessity for maintenance.

In the above description, the reference value is the curve showing the change in the Tup value of FIG. 2. However, this invention is not limited to such an arrangement but for example also includes an arrangement in which only one point of TupD is stored as a reference value and display or warning is issued only when the actual average temperature rise speed Tup reaches the TupD, or an arrangement in which reference values of several points on the curve of FIG. 2 are stored in addition to the TupD and display is carried out every time the Tup reaches respective points.

POSSIBLE INDUSTRIAL APPLICABILITY

As described above, the device for monitoring the deterioration of the battery is mounted on the electric motor-operated vehicle such as the electric motor-assisted bicycle and informs the rider of the battery replacement timing and the necessity for maintenance based on accurate information on the degree of deterioration in the battery capacity determined easily and accurately irrespective of ambient temperatures at which the battery is charged and discharged by comparing the actual value of average battery temperature rise speed with the reference value of average battery temperature rise speed. Also, the degree of battery deterioration may be accurately determined by calculating the average battery temperature rise speed. Furthermore, displaying the deterioration level and/or warning the battery deterioration make it possible to make the user aware of the battery replacement timing and the necessity for maintenance using a simple device.

What is claimed is:

1. A method for monitoring deterioration of a battery comprising the steps of storing a reference value of average battery temperature rise speed, measuring the initial temperature of the battery charging the battery for a predetermined time interval after the initial temperature is taken, measuring the battery temperature after charging for the predetermined time, calculating an average battery temperature rise speed from the temperature rise measured and the predetermined time interval, and comparing the actual value of average battery temperature rise speed with the reference value of average battery temperature rise speed to determine the degree of battery deterioration.

2. A battery deterioration monitoring method of claim 1, characterized in that a signal is given according to the determination of the battery deterioration.

3. A device for monitoring deterioration of a battery comprising reference value storage means for storing a reference value of average battery temperature rise speed, battery temperature detecting means for measuring the battery temperature during charging, battery temperature rise speed calculating means for obtaining an actual value of average battery temperature rise speed by measuring the battery temperature during charging at first and second time intervals and dividing the increase in battery temperature by the time interval, and battery deterioration determining means for determining the battery deterioration by comparing the actual computed value of average battery temperature rise speed with the reference value of average battery temperature rise speed.

4. A battery deterioration monitoring device of claim 3, characterized in that the battery temperature rise speed calculating means measures and stores the battery temperature at the start of charging with a constant current, and further obtains the average battery temperature rise speed over a specified period of time of charging by measuring the battery temperature after the specified period of time of charging.

5. A battery deterioration monitoring device of claim 4, wherein the device is provided with deterioration level display means for displaying the results of the comparison.

6. A device for monitoring deterioration of a battery as set forth in claim 5, wherein the display is of the battery deterioration level.

7. A device for monitoring deterioration of a battery as set forth in claim 5, wherein the display is a battery deterioration warning if the deterioration is greater than a predetermined amount.

8. A device for monitoring deterioration of a battery as set forth in claim 7, wherein the display further is of the battery deterioration level.

9. A battery deterioration monitoring method of claim 2, wherein the signal comprises an indication of the deterioration level of the battery.

* * * * *